United States Patent
Harvey et al.

(10) Patent No.: US 7,260,209 B2
(45) Date of Patent: Aug. 21, 2007

(54) METHODS AND APPARATUS FOR IMPROVING VOICE QUALITY IN AN ENVIRONMENT WITH NOISE

(75) Inventors: Michael T. Harvey, Centreville, VA (US); Michael P. Perri, Fairfax, VA (US)

(73) Assignee: Tellabs Operations, Inc., Naperville, IL (US)

( * ) Notice: Subject to any disclaimer, the term of this patent is extended or adjusted under 35 U.S.C. 154(b) by 292 days.

(21) Appl. No.: 10/810,996

(22) Filed: Mar. 26, 2004

(65) Prior Publication Data

US 2004/0247110 A1 Dec. 9, 2004

Related U.S. Application Data

(60) Provisional application No. 60/457,945, filed on Mar. 27, 2003.

(51) Int. Cl.
*H04M 1/00* (2006.01)
*H04M 3/00* (2006.01)

(52) U.S. Cl. .............. 379/392.01; 381/94.8; 704/233

(58) Field of Classification Search ......... 379/392.01; 381/71.1–73.1, 94.1–109
See application file for complete search history.

(56) References Cited

U.S. PATENT DOCUMENTS

| 4,630,305 | A | | 12/1986 | Borth et al. |
|---|---|---|---|---|
| 5,329,243 | A | | 7/1994 | Tay |
| 5,524,148 | A | * | 6/1996 | Allen et al. ............ 379/391 |
| 6,236,725 | B1 | | 5/2001 | Takada et al. |
| 6,351,532 | B1 | | 2/2002 | Takada et al. |
| 6,591,234 | B1 | * | 7/2003 | Chandran et al. ......... 704/225 |
| 2004/0101038 | A1 | * | 5/2004 | Etter ....................... 375/222 |
| 2005/0004796 | A1 | * | 1/2005 | Trump et al. ............ 704/225 |
| 2005/0264332 | A1 | * | 12/2005 | Chen et al. ............. 327/166 |

FOREIGN PATENT DOCUMENTS

EP 0 977 355 A2 * 2/2000

OTHER PUBLICATIONS

Heitkamper et al, "Adaptive Gain Control for Speech Quality Improvement and Echo Suppression", 1993, ISCAS'93, IEEE Int. Symp. on Circuits and Systems, May 3-6, 1993, pp. 455-458.*
Musch, Hannes, Sound ID Adaptive Noise Compensation, http://www.soundid.com/Modules/Technology/WP3ANC.pdf, pp. 1-6, Sound ID.
Jian, Zhongping, Adaptive Noise Cancellation, ELEC 434 Project Report, http://www-ece.rice.edu/~klwang/elec434/elec434.htm, Dec. 15, 2002, pp. 1-7, Rice University Dept. of ECE.

* cited by examiner

*Primary Examiner*—Ramnandan Singh
(74) *Attorney, Agent, or Firm*—Tellabs Law Department; Cheryl M. Fernandez, Esq.

(57) ABSTRACT

A method for improving a downlink signal received by a listener on a phone is disclosed. The method includes calculating an environment noise level of the listener and filtering and adjusting gain of the downlink signal based on the environment noise level.

20 Claims, 3 Drawing Sheets

METHODS AND APPARATUS FOR IMPROVING VOICE QUALITY IN AN ENVIRONMENT WITH NOISE

RELATED APPLICATIONS

This application claims the benefit of U.S. Provisional Application No. 60/457,945, filed on Mar. 27, 2003, entitled "METHODS AND APPARATUS FOR IMPROVING VOICE QUALITY IN A NOISY ENVIRONMENT", under 35 U.S.C. 119(e).

FIELD OF THE INVENTION

The present invention relates to speech signal management. More specifically, the present invention relates to improving the voice quality of a speech signal received by a listener in an environment with noise.

BACKGROUND OF THE INVENTION

The present invention can improve the voice quality of a speech signal received or heard by a person listening on a phone in an environment with noise. Particularly in the case where a listener is using a wireless phone, a listener may have difficulty listening to speech signals the listener receives because the listener is in an environment with noise, such a city environment where there is a lot of street noise. A natural response for a listener being in an environment with noise is to raise his or her voice in level and pitch. This response has been called the Lombard Effect. An existing approach to solving this problem of listening on a phone in an environment with noise is that the listener raises the volume of the ear piece of the phone. Existing approaches to solving the problem require the listener make adjustments to his or her speech and manual adjustments to the phone in order to help make the speech signal received by the listener dominate over the noise in the listener's environment or help make the listener feel as though he or she is returning a coherent speech signal amidst the environment with noise. An improvement to existing approaches does not require the listener to make such adjustments.

The present invention borrows the ideas of the Lombard Effect and a listener raising the volume of the ear piece to improve the voice quality of a speech signal received by a listener on a phone in an environment with noise. Accordingly, the present invention determines when the listener is in an environment with noise and based on the level of noise in the listener's environment, processes the speech signal received by the listener. As a result of this processing, the speech signal received by the listener can dominate over the noise in the listener's environment. Thus, the goal of the present invention is to make the speech signal received by a listener easier to hear and understand.

SUMMARY OF THE INVENTION

According to a first exemplary embodiment, a method for improving a downlink signal received by a listener on a phone is disclosed. The method includes calculating an environment noise level of the listener and filtering and adjusting gain of the downlink signal based on the environment noise level.

According to a second exemplary embodiment, a method for improving a downlink signal received by a listener on a phone is disclosed. The method includes calculating an environment noise level of the listener, delaying the downlink signal if the environment noise level is less than a first threshold and filtering and adjusting gain of the downlink signal if the environment noise level is higher than a second threshold.

An apparatus for improving a downlink signal received by a listener on a phone is disclosed. The apparatus includes a noise level calculator that calculates an environment noise level of the listener, a filter that filters the downlink signal and a gain controller that adjusts gain of the filtered downlink signal based on the environment noise level.

DESCRIPTION OF THE DRAWINGS

The present invention is illustrated by way of example and not by way of limitation in the figures of the accompanying drawings, in which like references indicate similar elements and in which.

DETAILED DESCRIPTION

By processing speech signals in the downlink direction of a phone network, the present invention can improve the intelligibility of the speech signal received by a listener on a phone. The present invention determines when a listener on a phone is in a high ambient noise environment and makes adjustments to the level and frequency response of a downlink speech signal received by the listener to improve the listener's intelligibility of the speech signal. An exemplary embodiment of the present invention samples the noise level in the uplink signal from a listener on a phone (picked up for example by the microphone on a phone) and processes the speaker's downlink signal to the listener on the phone.

An exemplary embodiment processes a speaker's downlink signal by filtering and adding gain to the downlink signal. Filtering includes adding emphasis to any high frequencies of the downlink signal; this can allow the speech to stand out from environmental noise (that is often predominantly low frequency noise). Filtering also includes removing any low frequency content of the downlink signal; this can allow the embodiment to add more gain without clipping. In filtering, what is considered a high frequency and a low frequency is predetermined and dependent upon a particular application. For example, the filter of the exemplary embodiment considers frequencies between 0-900 Hz to be low and frequencies between 900-4000 Hz to be high. The amount of filtering and gain that is applied is predetermined and dependent upon the level of environmental noise. For example, if the level of environmental noise is low, gain and filtering are not applied. What is considered low or high environmental noise is predetermined and dependent upon a particular application.

Figure 1:
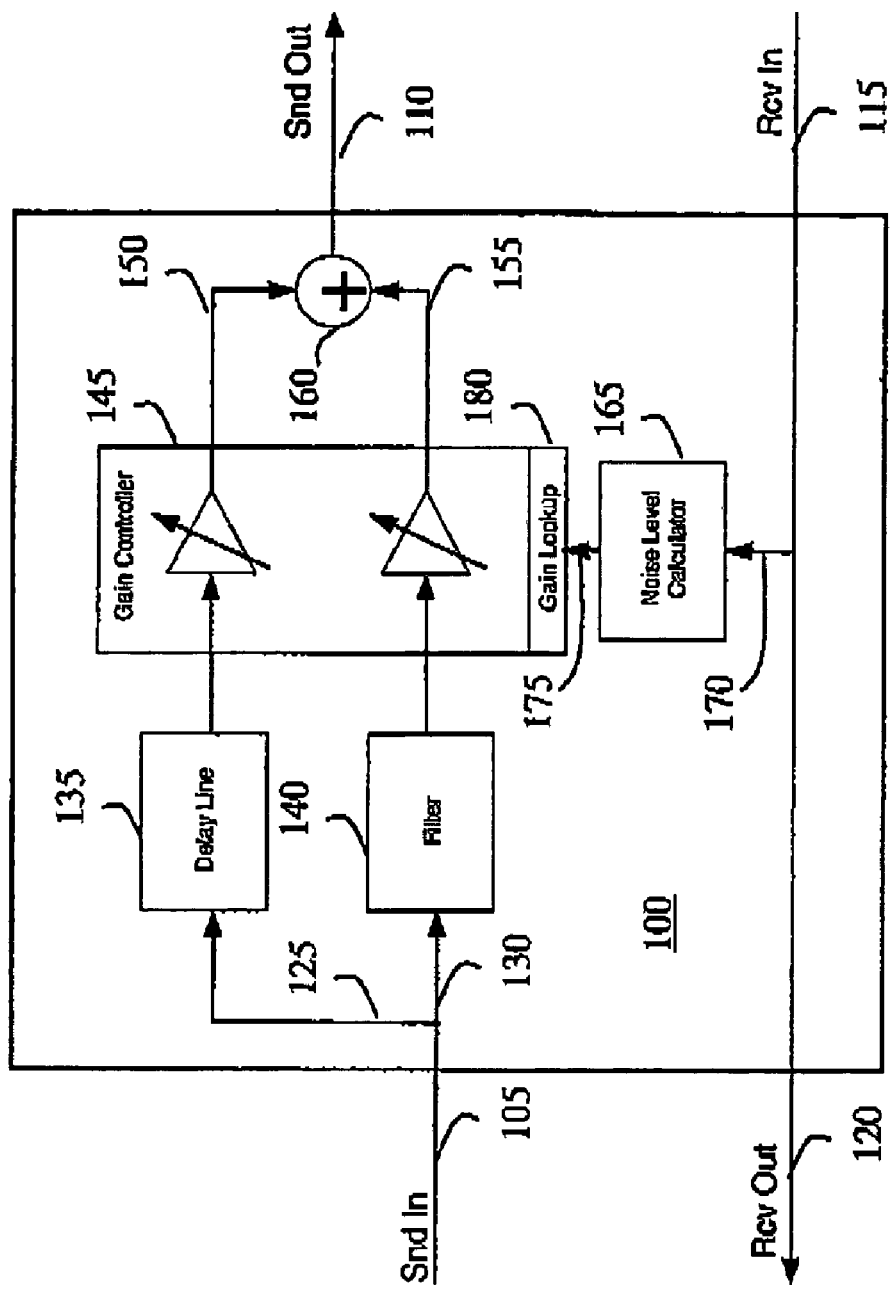
FIG. 1 is a block diagram of a voice quality improvement system, according to an exemplary embodiment of the present invention.

FIG. 1 is a block diagram of a voice quality improvement system, according to an exemplary embodiment of the present invention. A speaker's downlink signal is transmitted to voice quality improvement system 100 at line 105. The signal is then transmitted at line 125 so that it can be processed by delay line 135 and gain controller 145 and output from gain controller 145 as a first processed signal at line 150. The speaker's downlink signal is also transmitted at line 130 so that it can be processed by filter 140 and gain controller 145 and output from gain controller 145 as a second processed signal at line 155. Regarding filter 140 and delay line 135, an exemplary embodiment employs an FIR filter with 15 FIR filter taps for filter 140 and a 7 frame delay line for delay line 135 and an alternative embodiment employs an IIR filter and a 0 frame delay line for delay line 135. Adder 160 combines the first processed signal and the second processed signal. The voice quality improvement system 100 transmits the signal through line 110.

A listener's uplink signal is transmitted to voice quality improvement system 100 at line 115. The signal is then transmitted to noise level calculator 165 at line 170. Noise level calculator 165 can use the signal to calculate the noise level of the environment in which the listener's phone is being used. The noise level calculation is transmitted to gain controller 145 at line 175. Gain controller 145 can use the noise level calculation to adjust the amount of gain applied to the speaker's downlink signal or control the amount of processing performed on the signal based upon the noise level calculation. The listener's uplink signal is transmitted from voice quality improvement system 100 at line 120.

Figure 2:
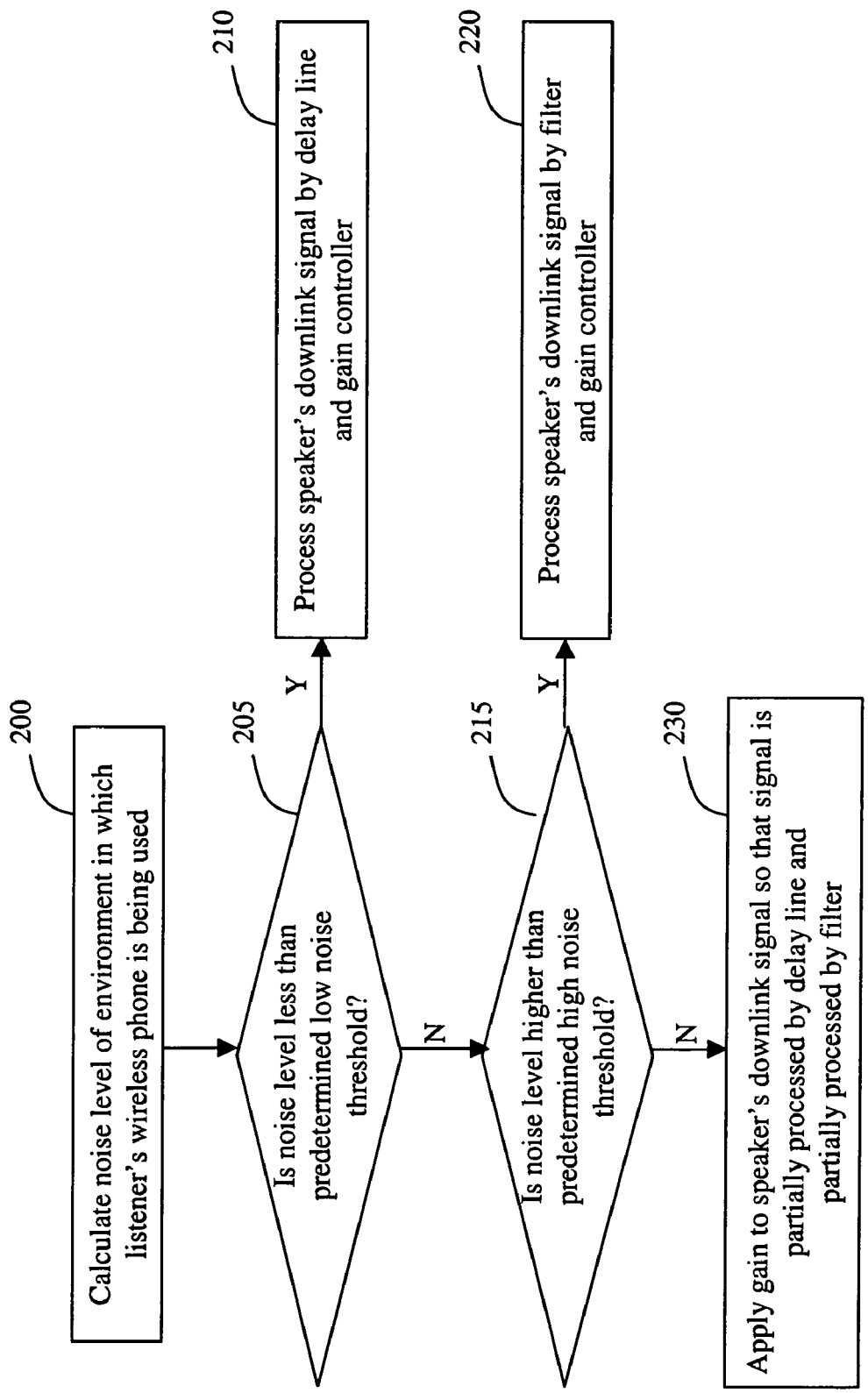
FIG. 2 is a flow diagram illustrating a method for managing a speech signal, according to an exemplary embodiment of the present invention.

FIG. 2 is a flow diagram illustrating a method for managing a speech signal, according to an exemplary embodiment of the present invention. At 200, the noise level of the environment in which listener's phone is being used is calculated. An exemplary embodiment calculates a slow moving or long time average of the noise level of the listener's uplink signal so that any changes in processing a voice quality improvement system are gradual. This embodiment can employ time constants that slow down the noise level average, for example a rise time constant of 200 ms and a fall time constant of 0.6 ms. An alternative embodiment employs a signal level averaging technique. For example, if the listener's uplink signal is larger than the current noise level average, the current noise level average is slightly increased. If the listener's uplink signal is smaller than the current noise level average, the average is greatly reduced. As a result of using a signal level averaging technique, the noise level average can gradually increase in response to background noise and can drop rapidly in response to absence of background noise.

At 205, the noise level is compared with a low noise threshold. The low noise threshold is a predetermined value, dependent upon a particular application. For example, −50 dBm could be a predetermined low noise threshold. If the noise level is less than the low noise threshold, next is 210. Otherwise, next is 215. At 210, the speaker's downlink signal is routed to and processed by a delay line and a gain controller. An exemplary embodiment could use delay line 135 and gain controller 145 shown in FIG. 1. At 215, the noise level is compared with a high noise threshold. The high noise threshold is a predetermined value, dependent upon a particular application. For example, −25 dBm could be a predetermined high noise threshold. If the noise level is higher than the high noise threshold, next is 220. Otherwise next is 230. At 220, the speakers down signal is muted to and processed by a filter and gain controller. An exemplary embodiment could use filter 140 and gain controller 145 shown in FIG. 1. At 230, predetermined values of gain are applied to the speaker's downlink signal or a predetermined amount of processing is performed on the signal depending upon the noise level. An exemplary embodiment could use a gain lookup, such as Gain Lookup 180 shown in FIG. 1, to look up the predetermined values of gain. The predetermined gain values or the processing amounts can be adjusted in response to a particular application. For example, predetermined gain values could be applied as follows:

If noise level is less than −45 dBm and greater than or equal to −50 dBm, gain applied is −3 dB.

If noise level is less than −40 dBm and greater than or equal to −45 dBm, gain applied is −6 dB.

If noise level is less than −35 dBm and greater than or equal to −40 dBm, gain applied is −12 dB.

If noise level is less than −30 dBm and greater than or equal to −35 dBm, gain applied is −18 dB.

If noise level is less than −25 dBm and greater than or equal to −30 dBm, gain applied is −24 dB.

As a result of executing 230, the speaker's downlink signal is partially routed to and processed by a delay line and a gain controller (using for example delay line 135 and gain controller 145 shown in FIG. 1) to generate a first processed signal and partially routed to and processed by a filter and gain controller (using for example filter 140 and gain controller 145 shown in FIG. 1) to generate a second processed signal. In executing 230, the delay line helps to synchronize the first and second processed signals.

Figure 3:
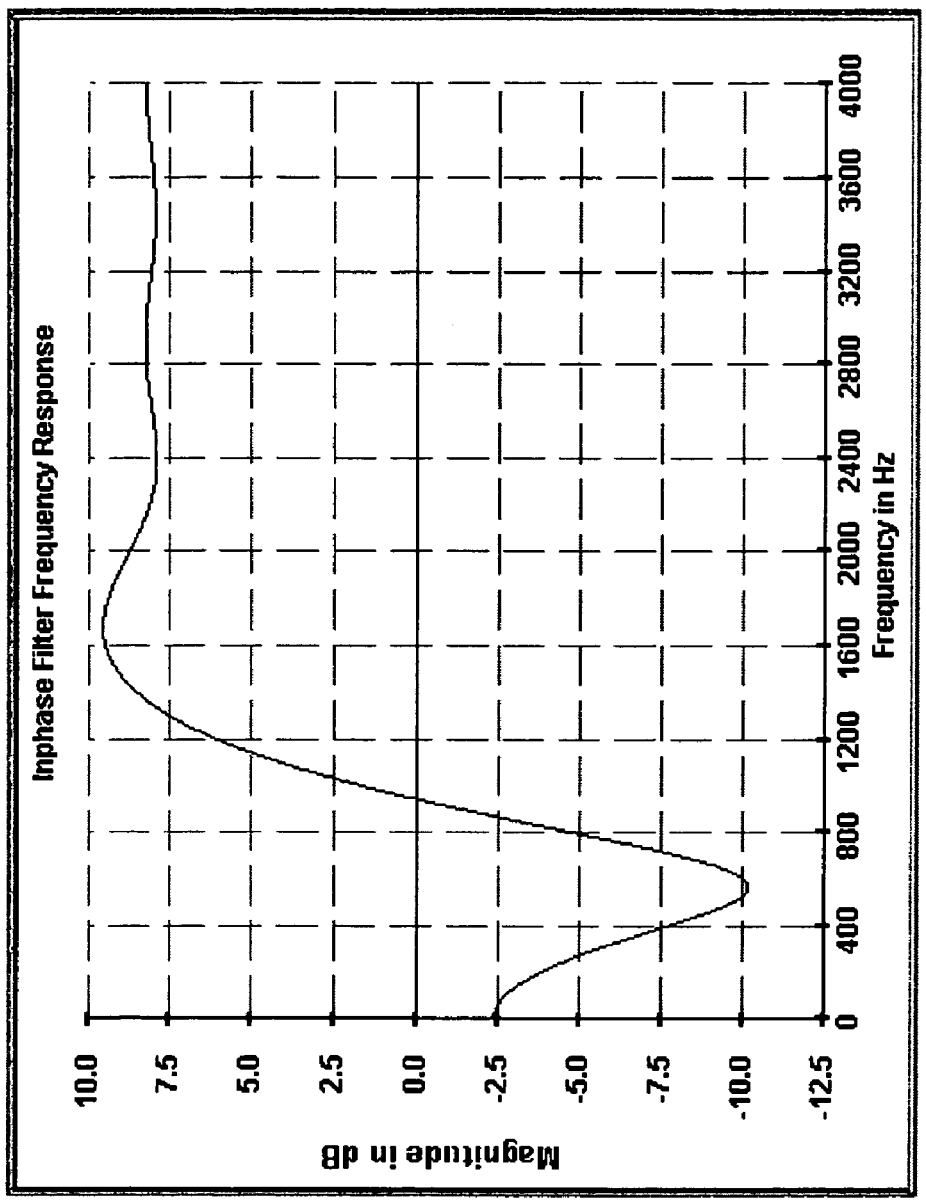
FIG. 3 is a graph illustrating the scaled frequency response of a filter employed by an exemplary embodiment of the present invention.

FIG. 3 illustrates the scaled frequency response of an exemplary embodiment filter such as for example filter 140 shown in FIG. 1. FIG. 3 shows that the filter is a high pass filter that adds emphasis or high frequency energy to the higher frequencies in the speaker's downlink signal to improve intelligibility of the signal. To add emphasis, the filter contains a gain stage so that the high pass filter produces a gain in the pass band. The gain stage is a predetermined gain at a predetermined frequency or range of frequencies and dependent upon a particular application. For example, FIG. 3 illustrates a gain stage that amplifies the signal by 9 dB at frequencies between 1600-4000 Hz. The filter also subtracts low frequency energy from the speaker's downlink signal. The amount of low frequency energy subtracted is a predetermined amount at a predetermined frequency or range of frequencies and dependent upon a particular application. For example, FIG. 3 illustrates a subtraction of 10 dB from the signal at a frequency of about 500 Hz. The coefficients of the exemplary embodiment filter before scaling are as follows in floating point format:

$$H(1)=-0.31150279E-03=H(15)$$

$$H(2)=0.32880172E-01=H(14)$$

$$H(3)=0.54618171E-01=H(13)$$

$$H(4)=0.26821463E-01=H(12)$$

$$H(5)=-0.50330563E-01=H(11)$$

$$H(6)=-0.12736719E+00=H(10)$$

$$H(7)=-0.16511263E+00=H(9)$$

$$H(8)=0.72750000E+00=H(8).$$

An exemplary embodiment implements voice quality improvement system 100 with microcode or software for a digital signal processor or ASIC.

In the foregoing description, the invention is described with reference to specific example embodiments thereof. It will, however, be evident that various modifications and changes may be made thereto, without departing from the broader spirit and scope of the present invention. For example, some of the steps illustrated in the flow diagram may be performed in an order other than that which is described. It should be appreciated that not all of the steps illustrated in the flow diagrams are required to be performed, that additional steps may be added, and that some of the steps may be substituted with other steps. Also, embodiments of the present invention may be provided as a computer program product, or software, that may include a machine-readable medium having stored thereon instructions. Further, a machine-readable medium may be used to program a computer system or other electronic device and the readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions. The specification and drawings are accordingly to be regarded in an illustrative rather than in a restrictive sense.

What is claimed is:

1. A method for improving a downlink signal received by a listener on a phone, comprising:
   calculating an environment noise level of the listener;
   delaying the downlink signal if the environment noise level is less than a first threshold; and
   filtering and adjusting gain of the downlink signal if the environment noise level is higher than a second threshold.

2. The method of claim 1, further comprising:
   delaying and adjusting gain of the downlink signal to create a delayed signal, if the environment noise level is greater than or equal to the first threshold and less then or equal to the second threshold;
   filtering and adjusting gain of the downlink signal to create a filtered signal, if the environment noise level is greater than or equal to the first threshold and less then or equal to the second threshold; and
   adding the delayed signal and the filtered signal if the environment noise level is greater than or equal to the first threshold and less then or equal to the second threshold.

3. The method of claim 1, wherein calculating the environment noise level comprises taking a slow moving average of a noise level of the listener's uplink signal.

4. The method of claim 3, wherein taking the slow moving average comprises employing time constants that slow down a noise level average.

5. The method of claim 3, wherein taking the slow moving average comprises employing rise and fall time constants.

6. The method of claim 1, wherein calculating the environment noise level comprises taking a long time average of a noise level of the listener's uplink signal.

7. The method of claim 6, wherein taking the long time average comprises employing time constants that slow down a noise level average.

8. The method of claim 6, wherein taking the long time average comprises employing rise and fall time constants.

9. The method of claim 1, wherein calculating the environment noise level comprises employing a signal level averaging technique to determine an average of a noise level of the listener's uplink signal.

10. The method of claim 9, wherein employing the signal level averaging technique comprises:
    increasing a current noise level average if the listener's uplink signal is larger than the current noise level average; and
    reducing the current noise level average if the listener's uplink signal is smaller than the current noise level average.

11. The method of claim 9, wherein employing the signal level averaging technique comprises:
    increasing slightly a current noise level average if the listener's uplink signal is larger than the current noise level average; and
    reducing greatly the current noise level average if the listener's uplink signal is smaller than the current noise level average.

12. An apparatus for improving a downlink signal received by a listener on a phone, comprising:
    a noise level calculator that calculates an environment noise level of the listener;
    a filter that creates a filtered downlink signal if the environment noise level is higher than a second threshold;
    a gain controller, coupled to the filter and the noise level calculator, that receives the filtered downlink signal and adjusts gain of the filtered downlink signal based on the environment noise level;
    a delay line, coupled to the gain controller, that creates a delayed downlink signal if the environment noise level is less than a first threshold, wherein the gain controller receives the delayed downlink signal and adjusts gain of the delayed downlink signal based on the environment noise level; and
    an adder coupled to the gain controller that adds the delayed downlink signal and the filtered downlink signal.

13. The apparatus of claim 12, wherein the filter is a high pass filter.

14. The apparatus of claim 12, wherein the filter is an FIR filter.

15. The apparatus of claim 12, wherein the filter is an IIR filter.

16. A computer readable storage medium storing instructions for improving a downlink signal received by a listener on a phone, wherein upon execution, the instructions instruct a processor to:
    calculate an environment noise level of the listener;
    delay the downlink signal if the environment noise level is less than a first threshold; and
    filter and adjust gain of the downlink signal if the environment noise level is higher than a second threshold.

17. The computer readable storage medium of claim 16, further comprising:
    delay and adjust gain of the downlink signal to create a delayed signal, if the environment noise level is greater than or equal to the first threshold and less then or equal to the second threshold;
    filter and adjust gain of the downlink signal to create a filtered signal, if the environment noise level is greater than or equal to the first threshold and less then or equal to the second threshold; and
    add the delayed signal and the filtered signal if the environment noise level is greater than or equal to the first threshold and less then or equal to the second threshold.

18. The computer readable storage medium of claim 16, wherein calculating the environment noise level comprises taking a slow moving average of a noise level of the listener's uplink signal.

19. The computer readable storage medium of claim 16, wherein calculating the environment noise level comprises taking a long time average of a noise level of the listener's uplink signal.

20. The computer readable storage medium of claim 16, wherein calculating the environment noise level comprises employing a signal level averaging technique to determine an average of a noise level of the listener's uplink signal.

* * * * *